US006454602B1

(12) United States Patent
Sharrow

(10) Patent No.: US 6,454,602 B1
(45) Date of Patent: Sep. 24, 2002

(54) HIGH VOLTAGE BULKHEAD CONNECTOR

(75) Inventor: Joseph F. Sharrow, Fredericksburg, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/804,647

(22) Filed: Mar. 13, 2001

(51) Int. Cl.$^{7}$ .................................................. H10R 9/05
(52) U.S. Cl. ....................... 439/584; 439/462; 439/874; 439/931
(58) Field of Search ................................ 439/462, 461, 439/584, 578, 874, 931, 454

(56) References Cited

U.S. PATENT DOCUMENTS

| | | | | |
|---|---|---|---|---|
| 1,882,856 A | | 10/1932 | Meuer | |
| 3,001,169 A | * | 9/1961 | Blonder | 439/461 |
| 3,117,357 A | | 1/1964 | Carver | 24/126 |
| 3,184,706 A | | 5/1965 | Atkins | |
| 3,430,187 A | * | 2/1969 | Man et al. | 439/462 |
| 3,668,612 A | | 6/1972 | Nepovim | |
| 3,722,925 A | | 3/1973 | Robbins | 285/55 |
| 3,854,789 A | * | 12/1974 | Kaplan | 439/584 |
| 4,211,464 A | | 7/1980 | Lee | |
| 5,052,946 A | * | 10/1991 | Homolka | 439/584 |
| 5,166,477 A | * | 11/1992 | Perin, Jr. et al. | 174/74 R |
| 5,934,937 A | * | 8/1999 | McCarthy | 439/583 |
| 5,998,736 A | * | 12/1999 | Rumsey | 174/84 R |

FOREIGN PATENT DOCUMENTS

| | | |
|---|---|---|
| GB | 810556 | 3/1959 |

* cited by examiner

*Primary Examiner*—Brian Sircus
*Assistant Examiner*—Son V. Nguyen
(74) *Attorney, Agent, or Firm*—James B. Bechtel, Esq.; Crane L. Lopes, Esq.; John P. McMahon, Esq.

(57) ABSTRACT

A high voltage bulkhead connector is disclosed that terminates and secures a standard silicon-jacket on a high voltage cable to a bulkhead and provides an easily disconnected electrical connection to an electrical device, such as a high voltage power supply.

15 Claims, 5 Drawing Sheets

HIGH VOLTAGE BULKHEAD CONNECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION 1.0 Field of the Invention

The present invention relates to a high voltage connector and, more particularly, to a high voltage connector used to terminate and secure a high voltage cable to a bulkhead and provide easily connected and disconnected electrical connections to another device, such as a high voltage power supply.

2.0 Description of the Related Art

High voltage connectors are often used to electrically connect cables covered with a thick silicone jacket serving as an electric insulator. These connectors need to be reliable while handling and delivering relatively large amounts of power between high voltage power sources. Current high voltage connectors often use permanent heavy bonding, and as such do not provide for an easily assembled and disassembled connector, especially for a bulkhead mounting in a ship. It is desired that a connector be provided for handling high voltage cables and that may be easily assembled and disassembled to accommodate desired electrical interconnections.

OBJECTS OF THE INVENTION

It is an object of the present invention to provide for a connector that terminates and secures standard silicon-jacketed high voltage cables.

It is another object of the present invention to provide for a connector that accommodates the high voltage cable and allows the connector to be easily mounted to a bulkhead and to also provide ease of connection and disconnection thereof.

It is another object of the present invention to provide a connector that secures a high voltage cable without providing electrical connections thereof.

It is still another object of the present invention to provide a connector that not only provides electrical connections of a high voltage cable, but also secures the high voltage cable within the connector.

SUMMARY OF THE INVENTION

The invention is directed to a connector that terminates and secures a standard silicon-jacketed high voltage cable and allows such cable to be easily connected and disconnected to a high voltage power supply.

The connector terminates and secures a high voltage cable having a jacket with a first predetermined outer diameter and serving as an electric insulator and surrounding an electrical conductor with a second predetermined outer diameter. The jacket surrounds the electrical connector except for an exposed section of the conductor having first and second ends with some of the first end being covered by the jacket. The connector comprises a body and a cap. The body has a stem with first and second ends, with the first end having a first bore dimensioned to be somewhat greater than the second predetermined outer dimension and having a socket therein dimensioned to snugly mate with the second end of the exposed section of the conductor. The body also has a main portion with first and second end sections and a second bore running at least partially therethrough and with the first end section mating with the second end of the stem and the second end section having a third predetermined outer diameter. The first section having said bore being dimensioned to be somewhat created in the first predetermined outer diameter. The cap has a third bore running therethrough and dimensioned to be somewhat greater than the first predetermined diameter. The cap also has a rim dimensioned so as to snugly cover and mate with the third predetermined outer diameter of the second section of the main portion.

BRIEF DESCRIPTION OF THE DRAWINGS

A better understanding of the present invention may be realized when considered in view of the following detailed description taken in conjunction with the accompanying drawings wherein.

DETAILED DESCRIPTION OF THE PREFERRED EMBODIMENTS

Figure 1:
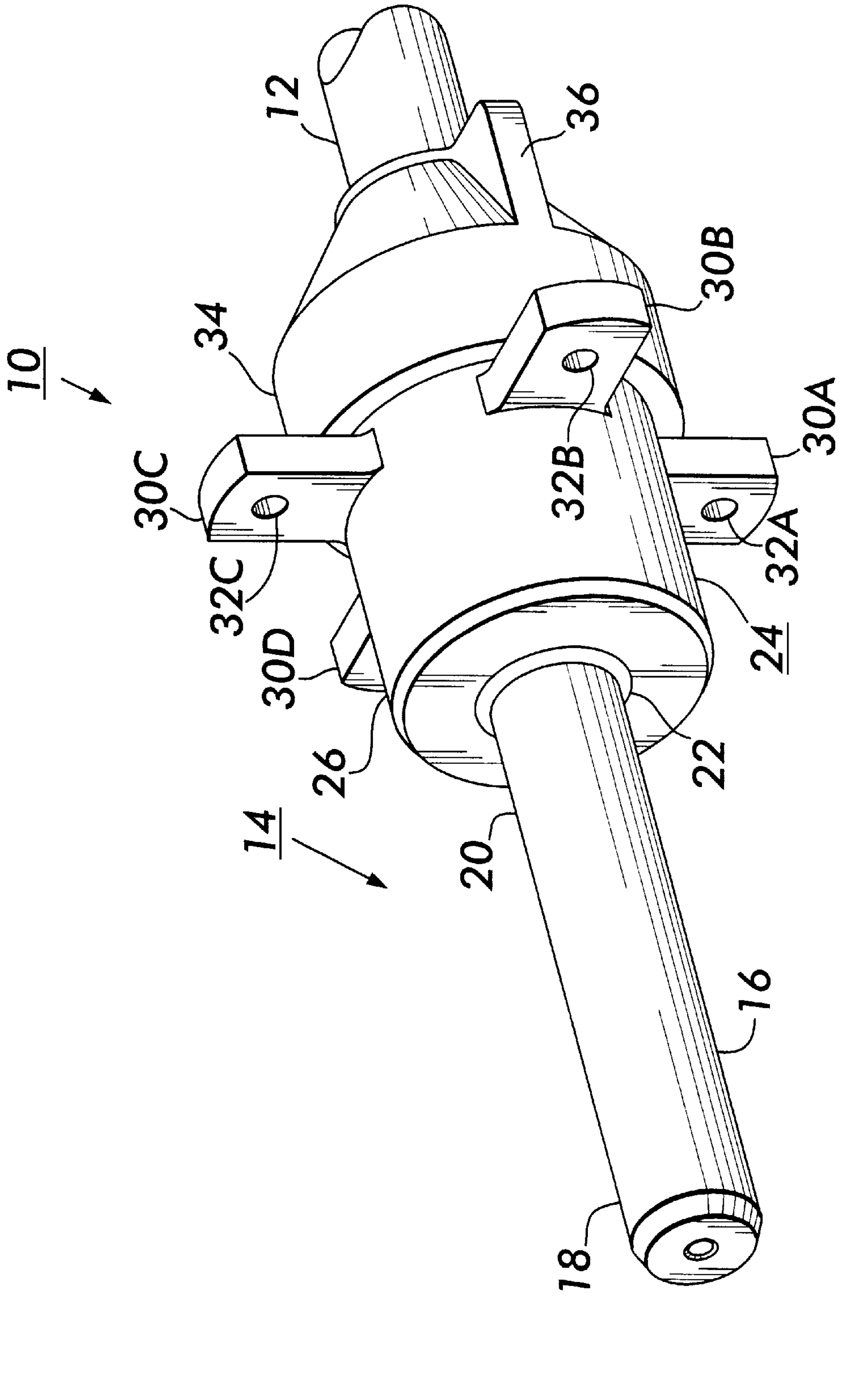
FIG. 1 is a front side perspective view of the connector of the present invention.

Referring to the drawings, wherein the same reference number indicates the same element throughout, there is shown in FIG. 1 a front side perspective view of one connector 10 of the present invention. The connector 10 is used for terminating and securing a high voltage cable 12 having a jacket with a first predetermined outer dimension and serving as an electric insulator and surrounding an electrically conductive conductor having a second predetermined outer dimension, except at an exposed section of the conductor having first and second ends, with some of the first end being covered by the jacket. The jacket and the conductor will be further described hereinafter with reference to FIG. 3.

As seen. in FIG. 1, the connector 10 comprises a body 14 having a stem 16 with first and second ends 18 and 20, respectively, and with an embossment 22 with mates up against a main portion 24 of the body 14.

The main portion 24 has first and second sections 26 and 28, respectively, which are separated from each other by at least one outward projection, but preferably a plurality of outward projections 30A, 30B, 30C, and 30D having respective openings 32A, 32B, 32C, and 32D (not shown in FIG. 1) respectively.

Figure 2:
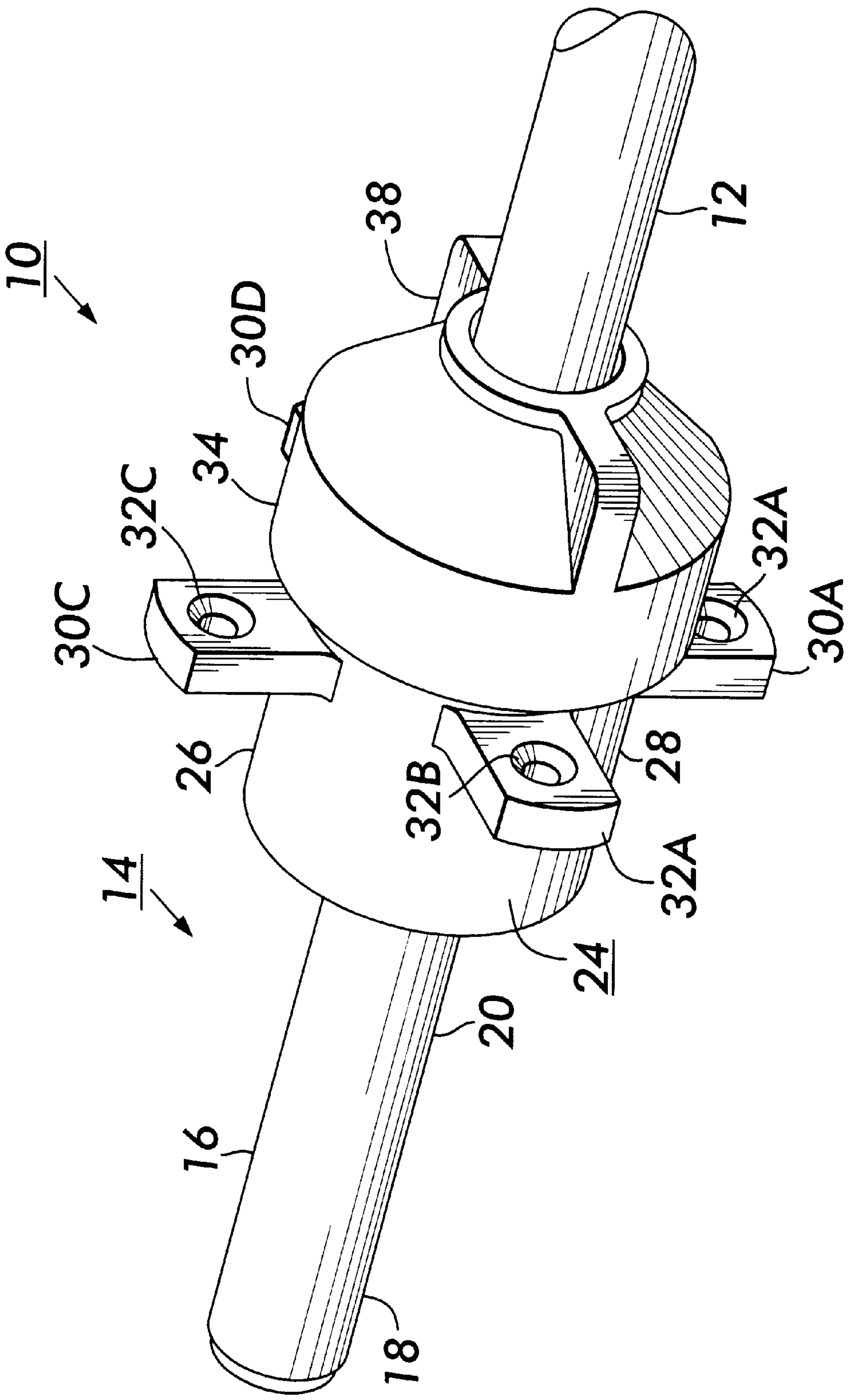
FIG. 2 is a rear side perspective view of the connector of the present invention.

The connector 10 further comprises a cap 34 provided with at least one, but preferably two knurls 36 and 38. Knurl 38 is not shown in FIG. 1, but is shown in FIG. 2 which illustrates a rear side perspective view of the connector 10 of the present invention. As can be envisioned from FIG. 2, the knurls 36 and 38 may be seized and held by a user to rotate the cap 34 so that it may be connected to the main body 24. The availability of knurls 36 and 38 eases the connection task of the user which may be considerable in light of the relatively high weight of the high voltage cable 12 and its bulkiness. More particularly, the knurls 38 and 40 provide gripping devices for assembling and disassembling the connector 20 without the need of any tools. All of the components making up the connector 10 are preferably comprised of a suitable non-electrically conductive material, such as acetal plastic. Further details of the interconnections associated with the connector 10 may be further described with reference to FIG. 3.

Figure 3:
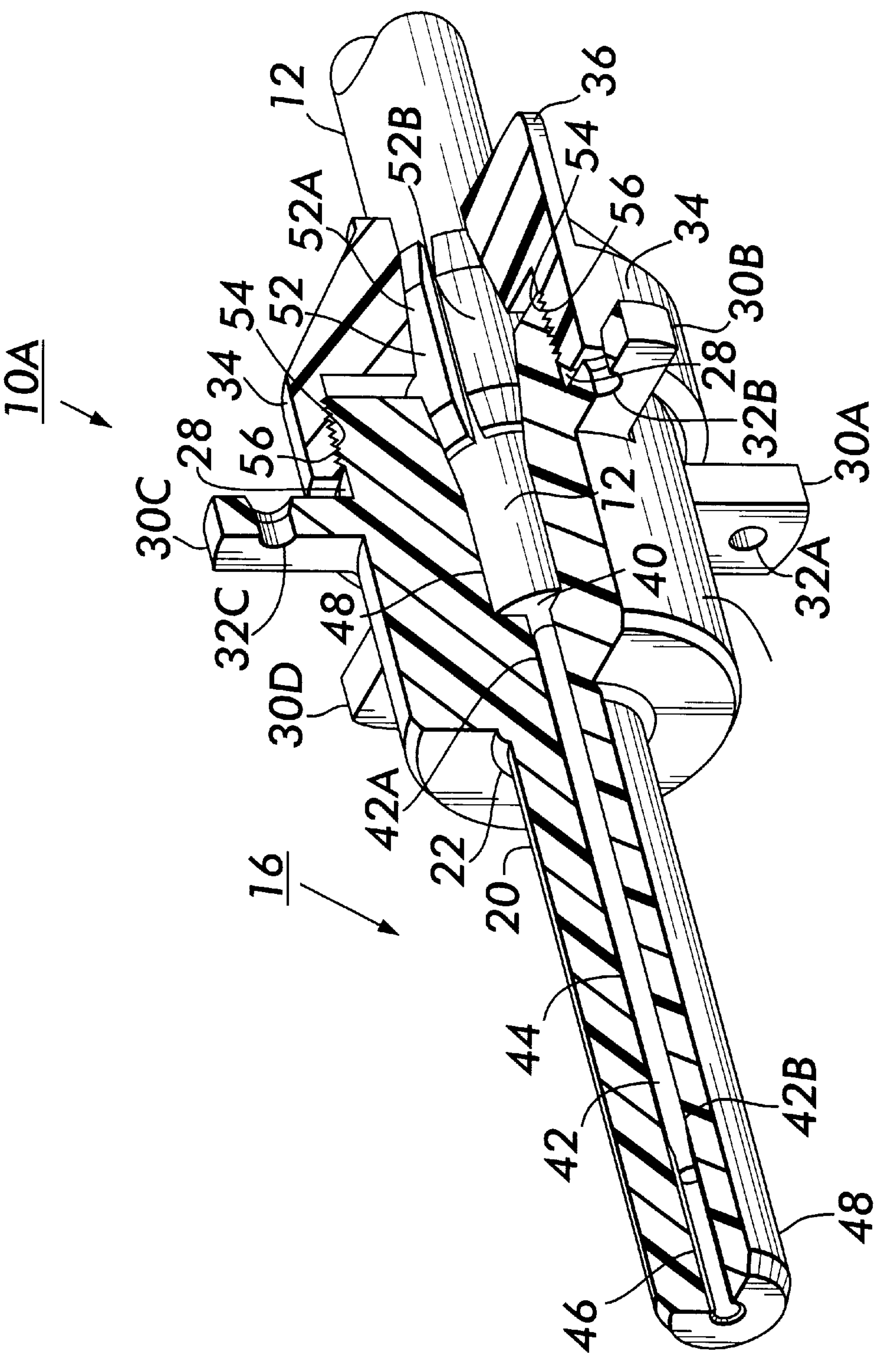
FIG. 3 is a side perspective view of the connector of the present invention partially cut away to illustrate further details of the connector.

FIG. 3 is a side perspective view of the connector 10 partially cut away to expose and illustrate further details of the present invention. FIG. 3 illustrates a cable 12 as having the jacket 40 with its first predetermined outer dimension. The jacket 40 surrounds an electrically conductive conductor 42, having a second predetermined outer diameter, except for an exposed section shown in FIG. 2 that has first and second ends 42A and 42B, respectively, with some of the first end 42A being covered by the jacket 40.

FIG. 3 illustrates the stem 16 as having a first bore 44, which is dimensioned to be somewhat greater than the second predetermined outer diameter of the conductor 42. The bore 44 also partially extends into the main portion 24 of the connector 10 so as to completely cover the exposed section of the electrical conductor 42. The stem 16, more particularly, the first end 18 of the stem 16 has a socket 46 lodged therein which is dimensioned so as to snugly mate with the second end 42B of the exposed section of the electrical conductor 42. The socket 46 may be electrically connected to second end 42B of the conductor 42 by appropriate means, such as by soldering.

The main portion 24 has a second bore 48, which is dimensioned to be somewhat greater than the first predetermined outer dimension of the jacket 40. The main section 24 further comprises a third bore 50 which is dimensioned to be greater than the second bore 48 so as to accommodate a ferrule 52.

The ferrule 52 is preferably made up of a non-electrically conductive material, such as plastic. The ferrule 52 is also preferably split along its axis so as to form two sections 52A and 52B, each of which is dimensioned so as to provide a close sliding fit arrangement with the high voltage jacket 40 of the cable 12 and so as to act as securing means for the jacket 40.

The second section 28 of the main body 24 is preferably provided with threads 54, which are complementary to threads 56 provided for the cap 34. The threads 54 and 56 provide mating between the cap and the second section 28 of the main body 24 so that these elements may be threadably and releasably engaged to each other. Although threads 54 and 56 are preferred, if desired, the second section 28 and the cap 34 may be dimensioned so as to frictionally engage each other.

Figure 4:
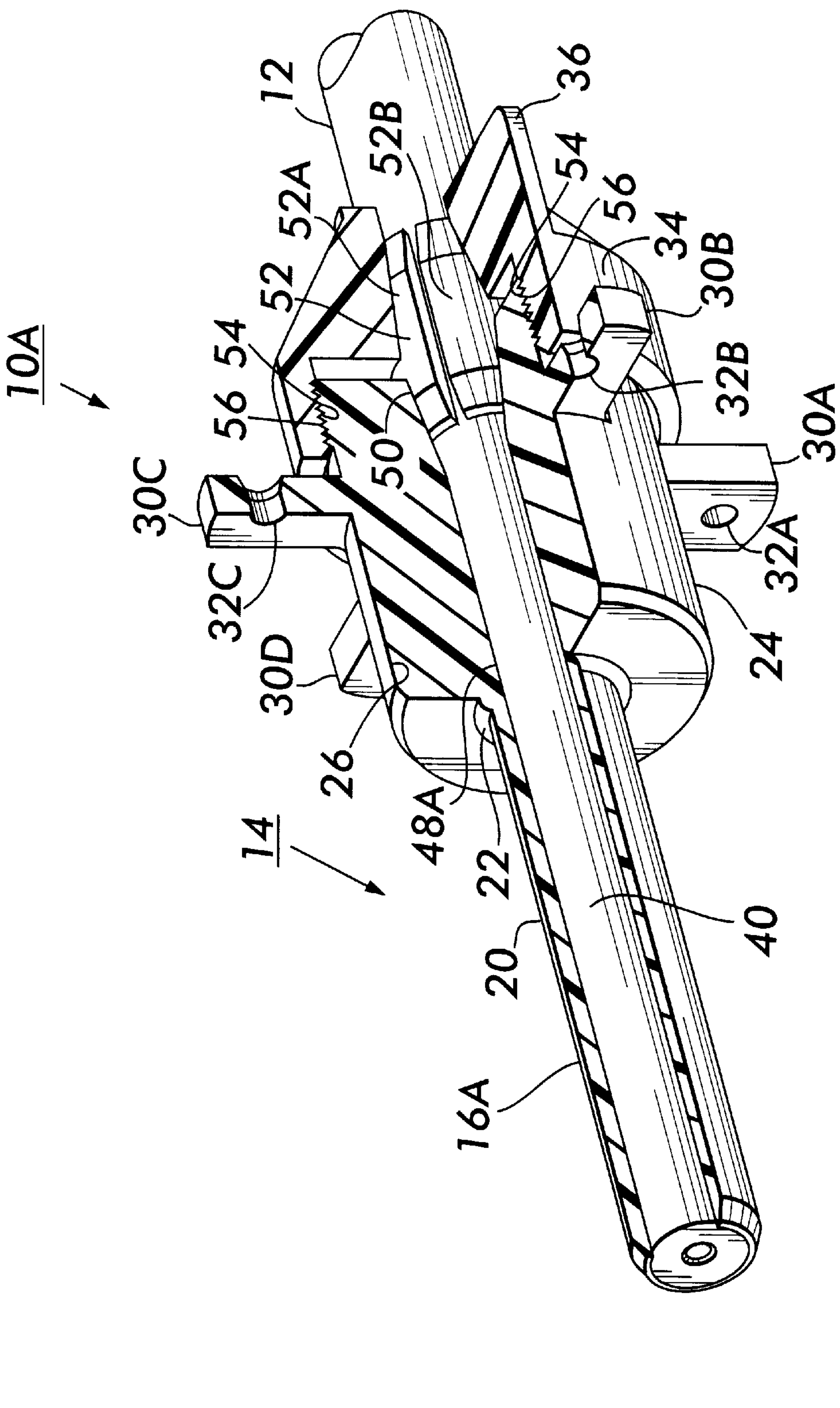
FIG. 4 is a side perspective view of another connector of the present invention that provides a securing function for a high voltage cable.

An alternate connector 10A of the present invention may be further described with reference to FIG. 4. The connector 10A of FIG. 4 is quite similar to the connector 10 of FIG. 3, with the exception that a bore 48A extends through a stem 16A and through the main portion 24 except that it does not extend into the bore 50.

In operation, the connector 10A secures the cable 12 in a so called "pass-through mode," but does not make any electrical connection with the conductor 42 of the cable 12. For this connector 10A, the high voltage cable 12 is not stripped away from the conductor 42. The bore 48A is large enough for the cable jacket 40 to pass completely through. The ferrule 52 is then tightened on the jacket 40, thereby securing the cable 12 as it passes through a bulkhead, to be hereinafter discussed with reference to FIG. 5. Adjustment of the cable 12 is achieved by loosening and then re-tightening of the cap 34.

In operation, to assemble the connector 10 of FIGS. 1–3, the jacket 40 of the high voltage cable 12 is first removed by a proper distance exposing the electrical conductor 42. The connector socket 46 is then soldered to the electrical conductor 42. The cap 34 and the ferrule 52 are then slid over the cable jacket 40 to their approximate locations generally shown in FIG. 3. The assembled cable 12 is then slid into the main body 24. The cap 34 and the ferrule 52 locations are then adjusted and the cap 34 is then tightened, thereby, securing the cable 12. The connection of the connector 10 to a bulkhead and to a power supply may be further described with reference to FIG. 5.

Figure 5:
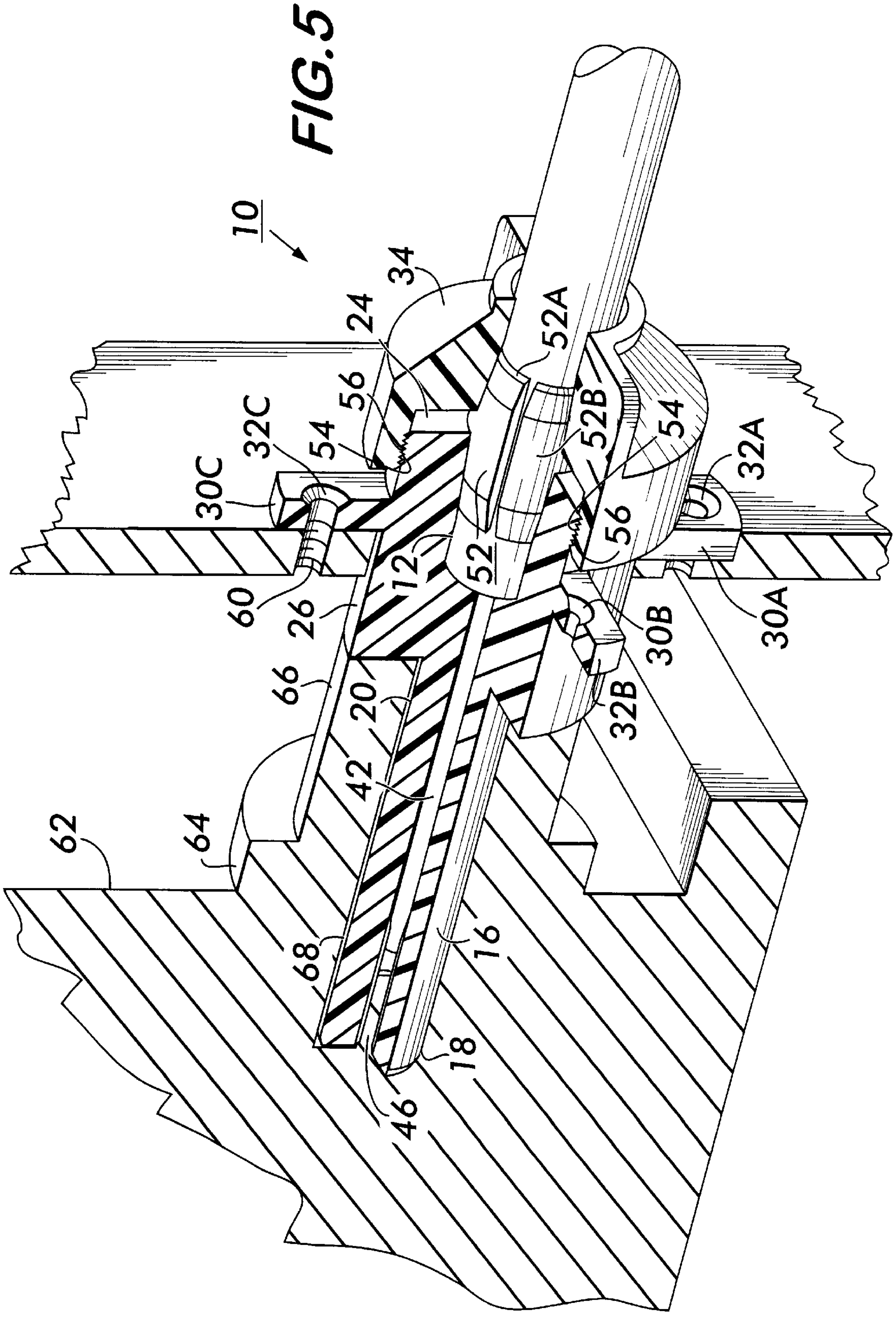
FIG. 5 is a side perspective view of one of the connectors of the present invention partially cut away to illustrate the details thereof and also showing the mounting of the connector to a bulkhead, as well as the insertion into a high voltage power supply.

FIG. 5 shows the connector assembly 10 arranged within a bulkhead 58. The bulkhead 58 is preferably provided with holes, such as 60, that are threaded so that a threaded member, such as a bolt (not shown), may be inserted into a opening complementary aligned with opening 60, such as opening 32C of the connector 10, and tightened, thereby, affixing the connector 10 to the bulkhead 58 by means of threaded engagement between the opening 60 and the threaded member. From FIG. 5 it is easily recognized that without the outward projections 30A, 30B, 30C and 30D the mounting of the connector 10 to the bulkhead 58 would be substantially more difficult.

FIG. 5 further illustrates the stem 16 inserted into a power supply 62 that is provided with a connector 64 having an extended member 66 and an internal bore 68 that accommodates the stem 16. After the connector 10 is installed in the bulkhead 58 and slid into place in the power supply 62, the electrical conductor 42 is appropriately connected to an electrical connection of the power supply 62.

It should now be appreciated that the practice of the present invention provides for a connector 10 that is used to terminate and secure a standard silicon-jacketed high voltage cable 12 to a bulkhead 58 and provides an easily connected and disconnected electrically connections to the high voltage power supply 62. Because there is no potting or sealing involved, disassembly of the connector 10 is achieved by simply reversing the procedure described for the assembly of the connector 10.

It should also be appreciated that the connector 10A may be used to secure, but not electrically connect the high voltage cable 12.

What I claim is:

1. A connector for terminating and securing a high voltage cable having a jacket with a first predetermined outer diameter and serving as an electric insulator and surrounding an electrically conductive conductor having a second outer predetermined diameter except for an exposed section of conductor, said exposed section having first and second ends with said first end of said exposed section of conductor covered by said jacket, said connector comprising:

a) A body having a stem with first and second ends and having a first bore dimensioned to be greater than said second predetermined outer diameter, said first end of said stem having a socket therein dimensioned to snugly mate with said second end of said exposed section of said conductor, said body having a main portion with first and second sections and a second bore running at least partially therethrough and with the first end section mating with said second end of said stem and the second end section having a third predetermined outer diameter, said first section having a second bore being dimensioned to be greater than said first predetermined outer diameter; and b) a cap having a third bore running therethrough and dimensioned to be greater than said first predetermined diameter, said cap having a rim dimensioned so as to snugly cover and mate with said third predetermined outer diameter of said second end section of said main portion.

2. The connector according to claim 1, wherein said second section of said second bore is dimensioned to be somewhat greater than said dimensions of said first section of said second bore and wherein said connector further comprises a ferrule placed over said jacket of said high voltage cable and confined within said second section of said second bore.

3. The connector according to claim 1, wherein said connector is comprised of an acetal plastic.

4. The connector according to claim 2, wherein said ferrule is comprised of a non-electrically conductive plastic.

5. The connector according to claim 2, wherein said ferrule is split in an axial manner.

6. The connector according to claim 1, wherein said cap and said second end of said main portion each has complementary threads so that said mating therebetween is provided with threadably and releasable engagement.

7. The connector according to claim 1, wherein said first and second end sections of said main portion are partially separated by at least one outward projection having an opening for the insertion of fastening means.

8. The connector according to claim 1, wherein said cap has an outer surface and wherein said cap is provided with two knurls arranged on said outer surface comprising a gripping surface for assembling and disassembling said connector free of any tools.

9. A connector for terminating and securing a high voltage cable having a jacket with a first predetermined outer diameter and serving as an electric insulator and surrounding an electrically conductive conductor comprising:

a body having a stem with first and second ends and having a first bore dimensioned to be greater than said first predetermined outer diameter, said body having a main portion with first and second sections with the first end section mating with second end of said stem and the second end section having a second bore dimensioned to be greater than said first bore;

a ferrule placed over said jacket of said high voltage cable and confined within said second section of said second end section of said main portion of said body; and a cap having a third bore running therethrough and dimensioned to be greater than said second bore so as to accommodate said ferrule, said cap having a rim dimensioned so as to snugly cover and mate with said second end section of said main portion of said body.

10. The connector according to claim 9, wherein said connector is comprised of acetal plastic.

11. The connector according to claim 9, wherein said ferrule is comprised of a non-electrically conductive plastic.

12. The connector according to claim 9, wherein said ferrule is split in an axial manner.

13. The connector according to claim 9, wherein said cap and said second end of said main portion of said body each has complementary threads so that said mating therebetween is provided with threadably and releasable engagement.

14. The connector according to claim 9, wherein said first and second end sections of said main portion of said body are partially separated by at least one outward projection having an opening for the insertion of fastening means.

15. The connector according to claim 9, wherein said cap has an outer surface and wherein said cap is provided with two knurls arranged on said outer surface comprising a gripping surface for assembling and disassembling said connector free of any tools.

* * * * *